(12) United States Patent
Shwartz et al.

(10) Patent No.: US 9,673,918 B1
(45) Date of Patent: Jun. 6, 2017

(54) METHODS AND APPARATUS FOR SELF-CALIBRATING NOISE FIGURES

(71) Applicant: QUALCOMM Incorporated, San Diego, CA (US)

(72) Inventors: Amir Shwartz, Yahud (IL); Elad Hadari, Haifa (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/154,746

(22) Filed: May 13, 2016

(51) Int. Cl.
| H04B 17/21 | (2015.01) |
| H04B 1/10 | (2006.01) |
| H04B 17/318 | (2015.01) |
| H04W 52/02 | (2009.01) |

(52) U.S. Cl.
CPC ........... *H04B 17/21* (2015.01); *H04B 1/1027* (2013.01); *H04B 17/318* (2015.01); *H04W 52/0229* (2013.01)

(58) Field of Classification Search
CPC combination set(s) only.
See application file for complete search history.

(56) References Cited

U.S. PATENT DOCUMENTS

| 8,699,984 B2 | 4/2014 | Mendoza et al. | |
| 2002/0173341 A1 | 11/2002 | Abdelmonem et al. | |
| 2003/0176174 A1* | 9/2003 | Seppinen | H04B 17/21 455/226.1 |
| 2003/0181180 A1* | 9/2003 | Darabi | H04B 1/406 455/234.1 |
| 2004/0198286 A1* | 10/2004 | Khorram | H04B 17/318 455/234.1 |
| 2008/0316130 A1* | 12/2008 | Rofougaran | H01Q 1/521 343/756 |
| 2011/0086603 A1* | 4/2011 | Toosi | H04B 1/1027 455/192.1 |
| 2015/0230185 A1 | 8/2015 | Vahid Far et al. | |

OTHER PUBLICATIONS

Blaakmeer S.C., et al., "Wideband Balun-LNA with Simultaneous Output Balancing, Noise-Canceling and Distortion-Canceling", IEEE Journal of Solid-State Circuits, IEEE Service Center, Piscataway, NJ, US, vol. 43, No, 6, Jun. 1, 2008 (Jun. 1, 2008), pp. 1341-1350, XP011215762.
Declercq F., et al., "Active Integrated Wearable Textile Antenna with Optimized Noise Characteristics", IEEE Transactions on Antennas and Propagation, vol. 58, No. 9, Sep. 2010, pp. 3050-3054.

* cited by examiner

*Primary Examiner* — Junpeng Chen
(74) *Attorney, Agent, or Firm* — Paul Holdaway; Joseph Agusta

(57) ABSTRACT

One aspect of this disclosure provides an apparatus for wireless communication. The apparatus comprises a low noise amplifier (LNA), an attenuator, and a processing system. The attenuator is configured to receive a signal from the LNA, generate a first attenuated signal based on the received signal, and generate a second attenuated signal based on the received signal. The processing system is configured to measure a first signal strength of the first attenuated signal at a position and measure a second signal strength of the second attenuated signal at the position. The processing system is further configured to determine a first value based on the first signal strength and the second signal strength and determine a second value based on the first attenuated signal and the second attenuated signal. The processing system is also configured to adjust a current of the LNA if the first value exceeds the second value.

19 Claims, 5 Drawing Sheets

METHODS AND APPARATUS FOR SELF-CALIBRATING NOISE FIGURES

BACKGROUND

Field of the Invention

The present application relates generally to wireless network communications and, more specifically, to systems, methods, and devices for communicating between wireless devices where reduced or optimized noise figures of the wireless device(s) are desired.

Description of the Related Art

In many telecommunication systems, communications networks are used to exchange messages among several interacting spatially-separated devices. Networks may be classified according to geographic scope, which could be, for example, a metropolitan area, a local area, or a personal area. Such networks would be designated respectively as a wide area network (WAN), metropolitan area network (MAN), local area network (LAN), wireless local area network (WLAN), or personal area network (PAN). Networks also differ according to the switching/routing technique used to interconnect the various network nodes and devices (e.g. circuit switching vs. packet switching), the type of physical media employed for transmission (e.g. wired vs. wireless), the set of communication protocols used (e.g. Internet protocol suite, SONET (Synchronous Optical Networking), Ethernet, etc.), and the frequency at which communications take place (e.g., 2.4 GHz, 5 GHz, 60 GHz, etc.).

Wireless networks are often preferred when the network elements are mobile and thus have dynamic connectivity needs, or if the network architecture is formed in an ad hoc, rather than fixed, topology. Wireless networks employ intangible physical media in an unguided or guided propagation mode using electromagnetic waves in the radio, microwave, infra-red, optical, etc. frequency bands. Wireless networks advantageously facilitate user mobility and rapid field deployment when compared to fixed wired networks.

Wireless devices that participate in wireless communications may be subject to various factors that affects their respective noise figures (NF). The noise figure of a device may be a measure of its "goodness" or relation to an ideal device. For example, a noise figure may characterize the ability for systems that process weak signals to properly process the received signals that are communicated. For example, systems having high noise figures may correspond to systems with worse performance than corresponding systems having low noise figures. The noise figure may also correspond to individual components that form the system, and may be measured in decibels (dB). For example, these systems may comprise a plurality of components, including a low-noise amplifier (LNA), a pre-amplifier, an IF amplifier, A/D or D/A converters (ADCs or DACs), attenuators, and other components. Each of these components may have individual noise figures, while the system as a whole may comprise an aggregate or total noise figure. The noise figure for the system may degrade (e.g., increase in amount) as additional components are included in the system or as other parameters of the system change and fluctuate during operation. For example, during operation, temperature of the components and system may change or fluctuate. Such a change may cause the noise figure of corresponding components to degrade (e.g., increase).

The degradation of the noise figure caused by the changes in temperature may be compensated for by calibrating one or more components of the system. In some aspects, calibrating the one or more components of the system may comprise adjusting one or more parameters of the one or more components. For example, one or more of the components may be adjusted to consume additional or less current to increase or decrease gain of the one or more components. However, such an increase in current consumption may result in an increased consumption of power or consuming more power than needed. Additionally, such calibration of the one or more components of the system may utilize external measurement instruments and/or precise gain measurements. Thus, improved systems, methods, and devices for calibrating noise figures for components or a system configured to perform wireless communications are desired.

SUMMARY

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section entitled "Detailed Description," one will understand how the features of the various aspects of this invention provide advantages that include improved communications between access points and stations in a wireless network.

One aspect of this disclosure provides an apparatus for wireless communication. The apparatus comprises a low noise amplifier (LNA), an attenuator, and a processing system. The attenuator is configured to receive a signal from the LNA, generate a first attenuated signal based on the received signal, and generate a second attenuated signal based on the received signal. The processing system is configured to measure a first signal strength of the first attenuated signal at a position and measure a second signal strength of the second attenuated signal at the position. The processing system is further configured to determine a first value based on the first signal strength and the second signal strength and determine a second value based on the first attenuated signal and the second attenuated signal. The processing system is also configured to adjust a current of the LNA if the first value exceeds the second value.

Another aspect disclosed is a method for wireless communication. The method comprises receiving a signal from a low noise amplifier (LNA). The method also comprises generating a first attenuated signal based on the received signal and generating a second attenuated signal based on the received signal. The method further comprises measuring a first signal strength of the first attenuated signal at a position and measuring a second signal strength of the second attenuated signal at the position. The method also further comprises determining a first value based on the first signal strength and the second signal strength and determining a second value based on the generated first attenuated signal and the generated second attenuated signal. The method further also comprises adjusting a current of the LNA based on the first value exceeding the second value.

Another aspect disclosed is an apparatus for wireless communication. The apparatus comprises means for receiving a signal. The apparatus also comprises means for generating a first attenuated signal based on the received signal and means for generating a second attenuated signal based on the received signal. The apparatus further comprises means for measuring a first signal strength of the first attenuated signal at a position and means for measuring a second signal strength of the second attenuated signal at the position. The apparatus also further comprises means for determining a first value based on the first signal strength and the second signal strength and means for determining a second value based on the first step and the second step. The apparatus further also comprises means for adjusting a current of the LNA if the first value exceeds the second value.

An additional aspect disclosed is a wireless access apparatus for wireless communication. The wireless access apparatus comprises an antenna, a low noise amplifier (LNA), an attenuator, and a processing system. The LNA is configured to amplify a signal received via the antenna. The attenuator is configured to receive a signal from the LNA, generate a first attenuated signal based on the received signal, and generate a second attenuated signal based on the received signal. The processing system is configured to measure a first signal strength of the first attenuated signal at a position, measure a second signal strength of the second attenuated signal at the position, determine a first value based on the first signal strength and the second signal strength, determine a second value based on the first attenuated signal and the second attenuated signal, and adjust a current of the LNA if the first value exceeds the second value.

An additional aspect discloses is a computer readable medium comprising instructions that, when executed, cause an apparatus to perform a method of wireless communication. The method comprises receiving a signal from a low noise amplifier (LNA). The method also comprises generating a first attenuated signal based on the received signal and generating a second attenuated signal based on the received signal. The method further comprises measuring a first signal strength of the first attenuated signal at a position and measuring a second signal strength of the second attenuated signal at the position. The method also further comprises determining a first value based on the first signal strength and the second signal strength and determining a second value based on the generated first attenuated signal and the generated second attenuated signal. The method further also comprises adjusting a current of the LNA based on the first value exceeding the second value.

BRIEF DESCRIPTION OF THE DRAWINGS

The above-mentioned aspects, as well as other features, aspects, and advantages of the present technology will now be described in connection with various aspects, with reference to the accompanying drawings. The illustrated aspects, however, are merely examples and are not intended to be limiting. Throughout the drawings, similar symbols typically identify similar components, unless context dictates otherwise. Note that the relative dimensions of the following figures may not be drawn to scale.

DETAILED DESCRIPTION

Figure 1:
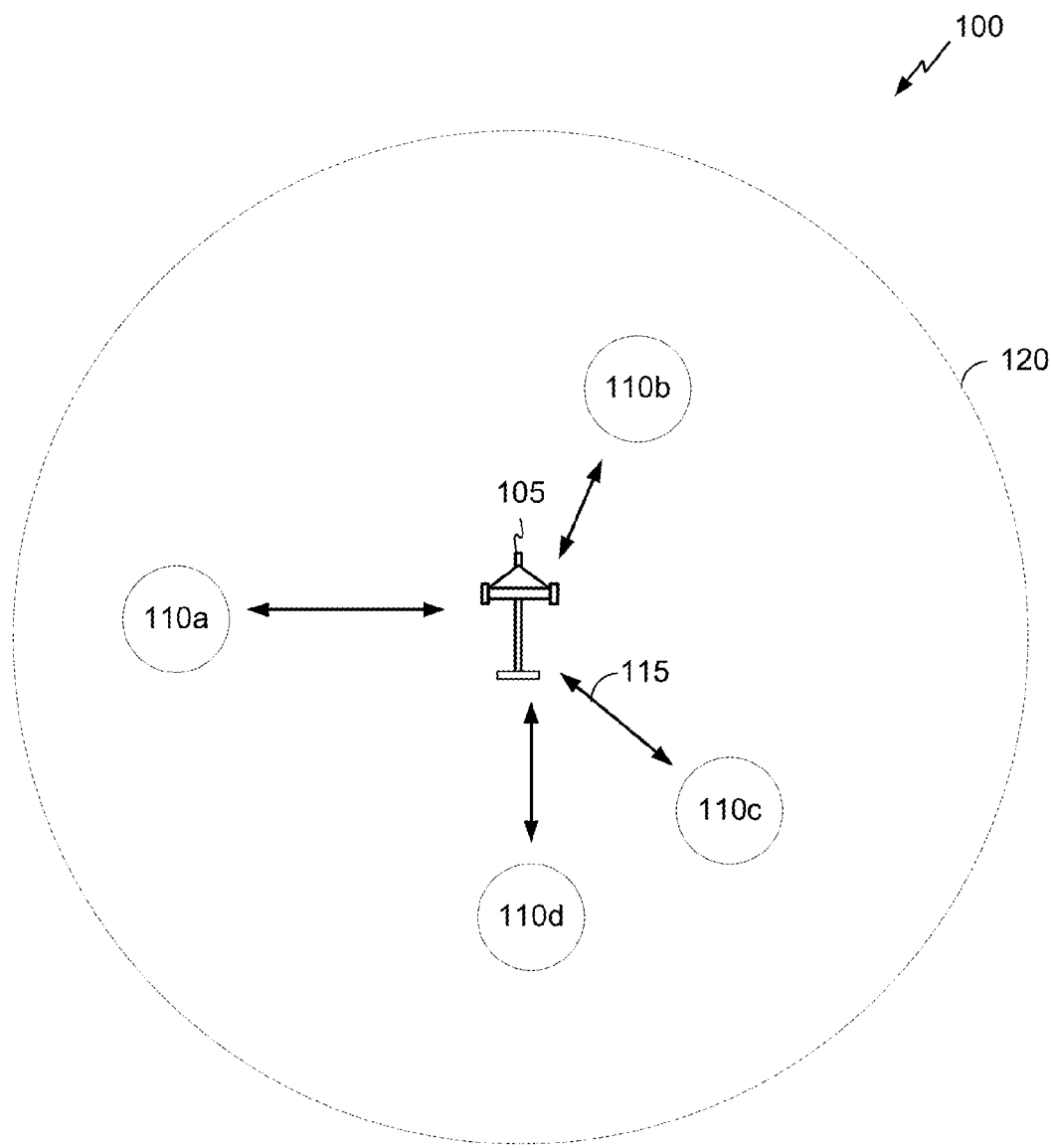
FIG. 1 illustrates one possible organization of a wireless communication system comprising a wireless network, an access point (AP), and multiple wireless access terminals.

Various aspects of the novel systems, apparatuses, and methods are described more fully hereinafter with reference to the accompanying drawings. The disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on teachings herein, one skilled in the art should appreciate that the scope of the disclosure is intended to cover any aspect of the novel systems, apparatuses, and methods disclosed herein, whether implemented independently of or combined with any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

Popular wireless network technologies may include various types of wireless local area networks (WLANs). A WLAN may be used to interconnect nearby devices together, employing widely used networking protocols. The various aspects described herein may apply to any communication standard, such as a wireless protocol.

In some aspects, wireless signals may be transmitted according to a high-efficiency 802.11 protocol using orthogonal frequency-division multiplexing (OFDM), direct-sequence spread spectrum (DSSS) communications, a combination of OFDM and DSSS communications, or other schemes. Aspects of the high-efficiency 802.11 protocol may be used for Internet access, sensors, metering, smart grid networks, or other wireless applications. Advantageously, aspects of certain devices implementing the high-efficiency 802.11 protocol using the techniques disclosed herein may include allowing for increased peer-to-peer services (e.g., Miracast, Wi-Fi Direct Services, Social Wi-Fi, etc.) in the same area, supporting increased per-user minimum throughput requirements, supporting more users, providing improved outdoor coverage and robustness, and/or consuming less power than devices implementing other wireless protocols.

In some aspects, a WLAN includes various devices which are the components that access the wireless network. For example, there may be two types of devices: access points ("APs") and clients (also referred to as stations, or "STAs"). In general, an AP may serve as a hub or base station for the WLAN and an STA serves as a user of the WLAN. For example, an STA may be a laptop computer, a personal digital assistant (PDA), a mobile phone, etc. In an example, an STA connects to an AP via a Wi-Fi (e.g., IEEE 802.11 protocol) compliant wireless link to obtain general connectivity to the Internet or to other wide area networks. In some aspects an STA may also be used as an AP.

An access point ("AP") may also comprise, be implemented as, or known as a NodeB, Radio Network Controller ("RNC"), eNodeB, Base Station Controller ("BSC"), Base Transceiver Station ("BTS"), Base Station ("BS"), Transceiver Function ("TF"), Radio Router, Radio Transceiver, or some other terminology.

A station "STA" may also comprise, be implemented as, or known as an access terminal ("AT"), a subscriber station, a subscriber unit, a mobile station, a remote station, a remote terminal, a user terminal, a user agent, a user device, user equipment, or some other terminology. In some aspects an access terminal may comprise a cellular telephone, a cordless telephone, a Session Initiation Protocol ("SIP") phone, a wireless local loop ("WLL") station, a personal digital assistant ("PDA"), a handheld device having wireless connection capability, or some other suitable processing device connected to a wireless modem. Accordingly, one or more aspects taught herein may be incorporated into a phone (e.g., a cellular phone or smartphone), a computer (e.g., a laptop), a portable communication device, a headset, a portable computing device (e.g., a personal data assistant), an entertainment device (e.g., a music or video device, or a satellite radio), a gaming device or system, a global positioning system device, or any other suitable device that is configured to communicate via a wireless medium.

A wireless node may comprise an access terminal ("AT") or STA, an AP or a relay-capable wireless device having at least one of a STA or AP operation, i.e., a wireless node may have AT or STA operation, AP operation, or both AT/STA and AP operations.

As discussed above, certain of the devices described herein may implement a high-efficiency 802.11 standard, for example. Such devices, whether used as an STA or AP or other device, may be used for smart metering or in a smart grid network. Such devices may provide sensor applications or be used in home automation. The devices may instead or in addition be used in a healthcare context, for example for personal healthcare. They may also be used for surveillance, to enable extended-range Internet connectivity (e.g. for use with hotspots), or to implement machine-to-machine communications. Although various systems, methods, and apparatuses are described herein with respect to a high-efficiency 802.11 standard, for example, a person having ordinary skill in the art will appreciate that the present disclosure is applicable to other wireless communication standards such as, for example, 802.11ah.'

Demand for higher bandwidth capability has been driving wireless communications devices with higher frequencies for many years. Frequency bands of devices have risen from megahertz (MHz) to the low gigahertz (GHz). A next step in this progression (e.g., as specified by IEEE 802.11ad), are frequency bands in the range of 57-64 GHz, often referred to as the "60 GHz frequency band."

The 60 GHz frequency band is an unlicensed band, which features a large amount of bandwidth. The large bandwidth means that a very high volume of information may be transmitted wirelessly. As a result, multiple applications that require transmission of a large amount of data may be developed to allow wireless communication around the 60 GHz band. Examples for such applications include, but are not limited to, wireless high definition TV (HDTV), wireless docking stations, wireless Gigabit Ethernet, and many others.

The 60 GHz frequency band presents challenges to radio frequency (RF) designers and engineers, such as absorption of signals by rough surfaces that would be transparent to lower frequencies, as well as issues with line-of-sight (LOS) communication of narrow beams that can easily be blocked by objects (including persons) standing in front of a transceiver device. The 60 GHz frequency band represents the center frequency. For the examples discussed herein, the spectrum of data communication may be +/−0.88 GHz from the center frequency, thus making the signal bandwidth (BW) 1.76 GHz. In some aspects, the spectrum of data communication may be greater than or less than +/−0.88 GHz from the center frequency, thus changing the signal BW.

FIG. 1 illustrates one possible organization of a wireless communication system 100 comprising a wireless network, an access point (AP) 105, and multiple wireless access terminals (e.g., devices) 110a-110d. In some aspects, communication paths 115 may comprise communications between the wireless devices 110a-110d and the AP 105. The AP 105 may generate a basic service area (BSA) 120 that represents the general coverage area of the AP 105. As shown, the AP 105 may be located at the center of the BSA 120, though the AP 105 may be positioned anywhere within the BSA 120.

As depicted, the system 100 may be capable of wireless communications, for example, pursuant to an 802.11ad (60 GHz) millimeter wave (mmwave) standard. Accordingly, each of the AP 105 and the wireless devices 110a-110d may be capable of 802.11ad communications. In some aspects, any other communication standard or protocol may be used by the AP 105 and the wireless device 110a-110d. The BSA 120 may represent the area within which the AP 105 may be able to communicate with and associate with the wireless devices 110a-110d. The size of the BSA 120 may be based at least on the power of the AP 105 or the environment in which the AP 105 is operating.

In some aspects, the AP 105 may act as a base station and may provide wireless communication coverage in the BSA 120. The AP 105 and the wireless devices 110a-110d associated with the AP 105 and that use the AP 105 for communication may be referred to as a basic service set (BSS).

Figure 2:
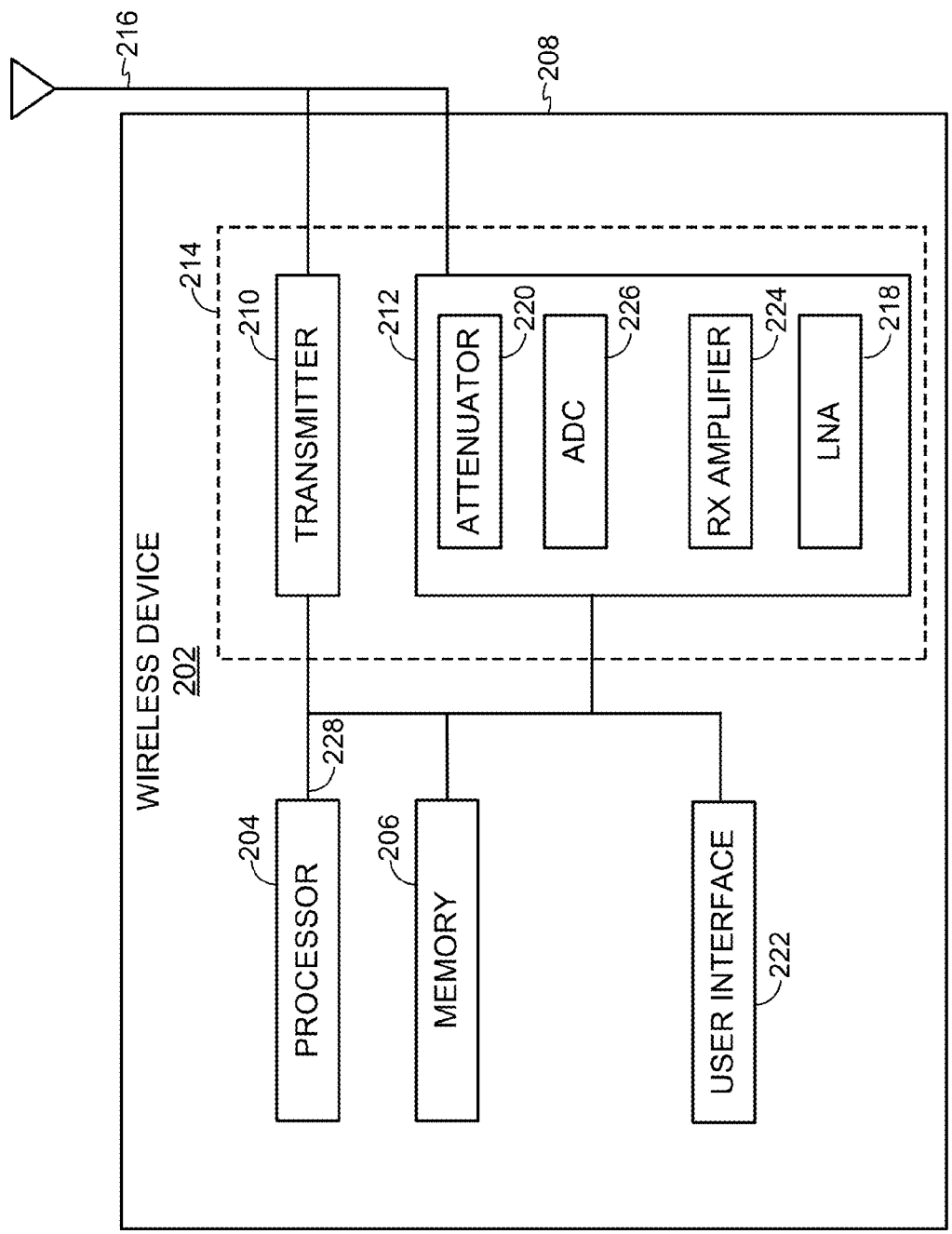
FIG. 2 shows an aspect of a device which may comprise one or more of the devices of FIG. 1.

FIG. 2 shows an aspect of a device 202 which may comprise one or more of the AP 105 or the wireless device 110 of FIG. 1. The device 202 is an example of a communication device that may implement the various methods and processes described herein.

The device 202 may include a processor 204 which controls operation of the device 202. The processor 204 may also be referred to as a central processing unit (CPU). In some aspects, the processor 204 may be configured to perform various calculations based on inputs or operation of components of the device 202 or adjustments of operating conditions and parameters of the components of the device 202.

Memory 206, which may include both read-only memory (ROM) and random access memory (RAM), may provide instructions and data to the processor 204. For example, inputs received by one or more components of the device 202 may be stored in the memory 206. A portion of the memory 206 may also include non-volatile random access memory (NVRAM). The processor 204 typically performs logical and arithmetic operations based on program instructions and inputs and other information stored within the memory 206. The instructions in the memory 206 may be executable to implement the methods described herein.

The processor 204 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein. Accordingly, the processing system may include, e.g., hardware, firmware, and software, or any combination therein.

The device 202 may also include a housing 208 that may include one or more of the components as shown in FIG. 2, including a transmitter 210 and/or a receiver 212. The transmitter 210 and receiver 212 allow transmission and reception of data, respectively, between the device 202 and a remote location or device (e.g., the other of the AP 105 and the wireless device 110). The transmitter 210 and receiver 212 may be combined into a transceiver 214. An antenna 216 may be attached to the housing 208 and electrically coupled to the transceiver 214. The device 202 may also include (not shown) multiple transmitters, multiple receivers, multiple transceivers, and/or multiple antennas. In some aspects, the transmitter 210, receiver 212, or transceiver 214 may be configured to communicate according to the 802.11ad standard or in the 60 GHz frequency range.

The transmitter 210 can be configured to wirelessly transmit messages. The processor 204 may process messages and data to be transmitted via the transmitter 210. The receiver 212 can be configured to wirelessly receive messages. The processor 204 may further process messages and data received via the receiver 212. In some aspects, the receiver 212 may comprise a chain of components and may be referred to as a receiver chain 212.

Figure 3:
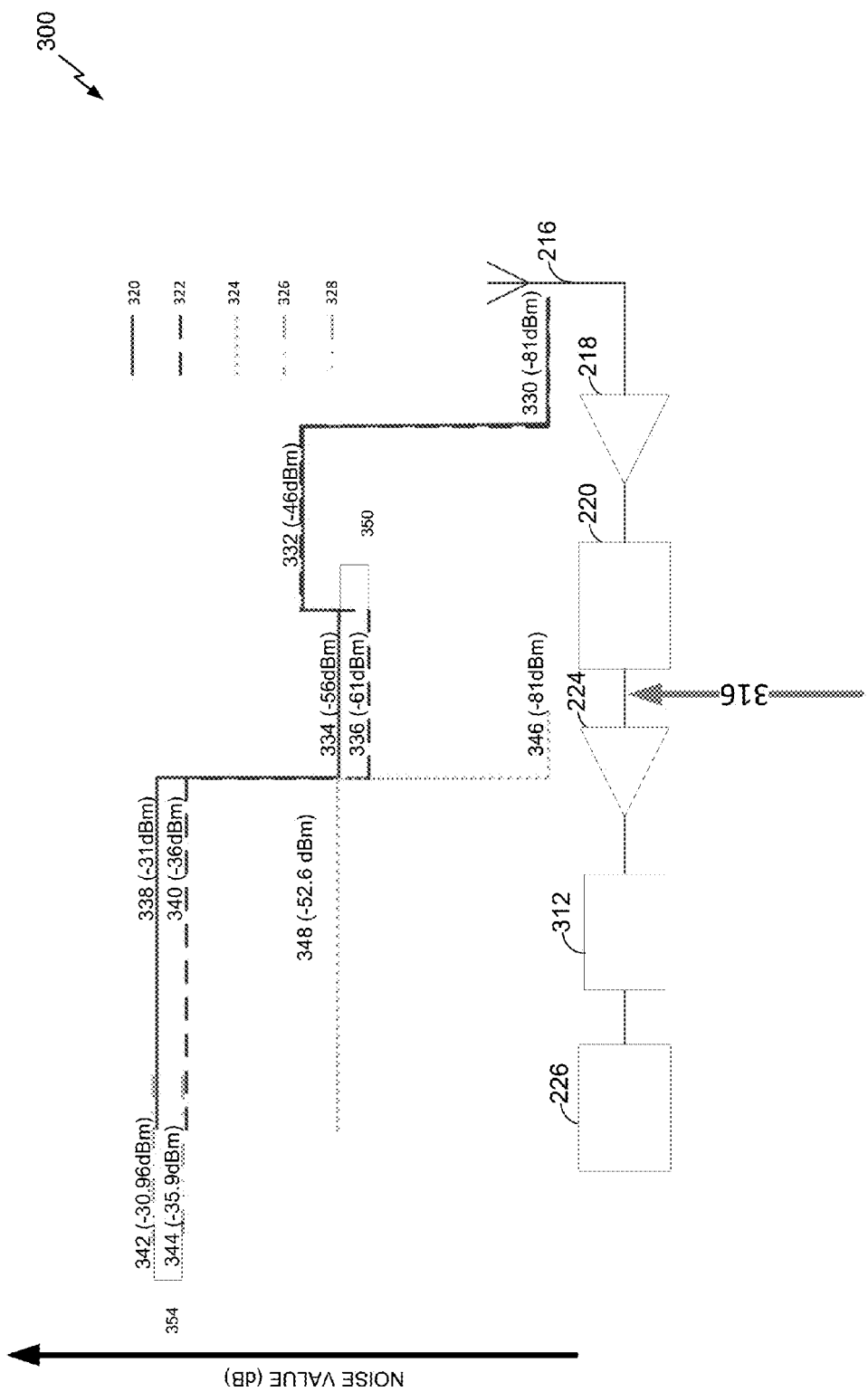
FIG. 3 illustrates one possible organization of components of a system where further adjustment of a calibration of the system is not necessary based on conditions to which the system is exposed, alongside a graph of the noise as introduced by a received signal and influenced by components of the system and the conditions to which the system is exposed.
Figure 4:
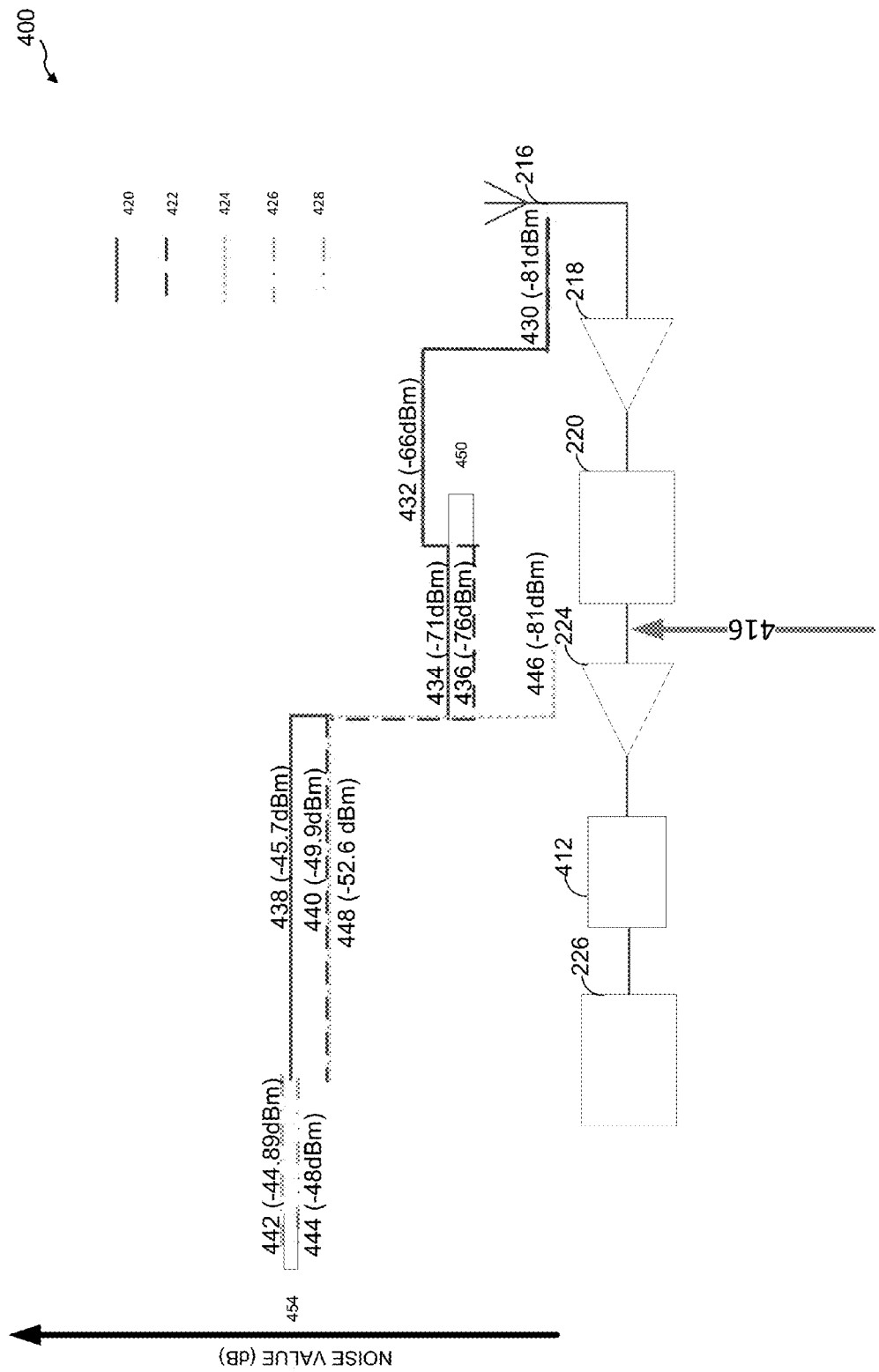
FIG. 4 illustrates the system of FIG. 3, where further adjustment of the calibration of the system is necessary based on different conditions to which the system is exposed, alongside a graph of the noise as introduced by a received signal and influenced by components of the system and the conditions to which the system is exposed.

The receiver may include a low noise amplifier (LNA) 218 that may be used to amplify signals received. The LNA 218 may amplify very weak signals that may not be otherwise recognizable while adding minimal noise. For example, the LNA 218 may comprise multiple parameters that may impact the noise of a signal passing through (amplified by) the LNA 218. The LNA 218 may comprise a gain value (G) and a noise figure value (F). The LNA 218, as is shown in FIGS. 3 and 4, may be located close in series with the source of the signal (i.e., the antenna 216 in a receiving device) (e.g., without any intervening components between the LNA 218 and the antenna 216) in order to minimize losses. Such amplification as performed by the LNA 218 enables components further away from the signal source (e.g., downstream from the LNA 218) to utilize the signal without adding noise as compared to a non-low-noise amplifier. In some aspects, the processor 204 or some other components of the device 202 may be configured to control a current input into the LNA 218, which may impact the amplification provided by the LNA 218 or may control the relationship between the amplification and the noise added by the LNA 218. For example, in some aspects, adjusting the current input into the LNA 218 may affect the gain (G) and noise figure (F) of the LNA 218.

As described herein, the various noise measurements may sometimes correspond to linear units and sometimes correspond to logarithmic units. Accordingly, the noise figure, gain, and thermal noise values may sometimes be identified and calculated in linear units and other times in logarithmic units, depending on the context. For example, where noise calculations are referenced linear units (e.g., Noise out=KTB*G*F), each of the noise figure and gain values are in linear units. Where noise calculations are referenced in logarithmic units (e.g., Noise out=10*log 10(KTB*1000)+10*log 10(G)+10*log 10(F)), each of the noise figure and gain values are assumed to already be in logarithmic units, e.g., G[dB]=10*log 10(G).

The receiver 212 may also include an attenuator 220. The attenuator 220 may comprise components that help reduce power in a received signal without distorting the signal's waveform. The attenuator 220 may effectively perform the reverse of an amplifier (e.g., the LNA 218) or the receiver amplifier 224 (discussed below). Accordingly, the attenuator 220 may have a noise figure (F) and a loss (L). The attenuator 220 may be a passive device. Accordingly, instead of introducing a gain to the signal, as a result of processing the signal it receives, the attenuator 220 may instead introduce a loss (e.g., a negative gain). While the receiver amplifier 224 provides gain, the attenuator 220 provides loss (e.g., gain less than 0) to the signal. Accordingly, the gain value G of the attenuator 220 may be assumed to be equal to '−L' and '−F'. In some aspects, the attenuator 220 may allow a user to vary the attenuation performed by the attenuator 220 (e.g., loss introduced to the signal).) In some aspects, the attenuator 220 may comprise one or more switches or similar components or may be a step attenuator, configured to provide attenuation at one or more different levels. In some aspects, the attenuator 220 may be configured to attenuate the received signal at multiple levels (e.g., steps) to one or more other components of the device 202 downstream of the attenuator 220. Each level of attenuation of the received signal may comprise a different attenuated signal corresponding to the level of attenuation applied.

The device 202 may further comprise a user interface 222 in some aspects. The user interface 222 may comprise a keypad, a microphone, a speaker, and/or a display, among others. The user interface 222 may include any element or component that conveys information to a user of the device 202 and/or receives input from the user.

The receiver may also comprise one or more receiver amplifiers 224. In some aspects, the one or more receiver amplifiers 224 may be configured to amplify signals after they have been attenuated by the attenuator 220. In systems with multiple receiver antenna or receiver circuits, each receiver antenna or receiver circuit may comprise its own receiver amplifier 224. In some aspects, the receiver amplifier 224 may not comprise a low-noise amplifier (based at least in part on its position not being near the beginning of the component chain of the receiver 212), such that amplification by the receiver amplifier 224 may also increase the noise of amplified signal accordingly.

The various components of the receiver may further include an A/D or D/A converter (ADC or DAC) 226. For example, the A/D converter 226 may convert the signal received by the antenna 216 and amplified and attenuated by the LNA 218, attenuator 220, or receiver amplifier 224. Converting the received signal to digital may allow other downstream components to utilize the received signal. The components of the device 202 may be coupled together by a bus system 228. The bus system 228 may include a data bus, for example, as well as a power bus, a control signal bus, and a status signal bus in addition to the data bus. The components of the device 202 may be coupled together or accept or provide inputs to each other using some other mechanism.

Although a number of separate components are illustrated in FIG. 2, one or more of the components may be combined or commonly implemented. For example, the processor 204 may be used to implement not only the functionality described above with respect to the processor 204, but also to implement the functionality described above with respect to the ADC 226, the LNA 218, the receiver amplifier 224, and/or the attenuator 220. For example, the attenuator 220 may be disposed within the wireless device 202 but not within the receiver 212. Further, each of the components illustrated in FIG. 2 may be implemented using a plurality of separate elements.

FIG. 3 illustrates one possible organization of components of a system 300 where adjustment of a calibration of the system 300 is not necessary based on conditions to which the system 300 is exposed. A graph of the noise as introduced by a received signal and influenced by components of the system 300 and the conditions to which the system 300 is exposed is also shown in FIG. 3. In some aspects, the system 300 may correspond to the receiver 212 and antenna 216 of the device 202 and one or more of the AP 105 and the wireless devices 110a-110d. The antenna 216 may be configured to receive or transmit a signal. The antenna 216 may be coupled to a receiver low noise amplifier (LNA) 218.

The LNA 218 may be configured to amplify any signal(s) received by the antenna 216. In some aspects, the LNA 218 may comprise a gain G=25 dB and a noise figure F=5 dB. However, in other aspects, the LNA 218 may have any other gain or noise figure values. The LNA 218 then feeds the received signal to an attenuator 220.

The attenuator 220 may be configured to attenuate noise of the signal received from the LNA 218. The attenuator 220 may be configured to attenuate the noise of the received signal at variable amounts. In some aspects, the attenuator 220 may comprise a step attenuator.

The noise of the received signal may vary based on conditions to which the attenuator 220 or upstream components are exposed (e.g., temperature, process materials, etc.). However, the noise delta (i.e., loss or "attenuator gain") as applied by the attenuator 220 (e.g., noise delta from attenuator input to attenuator output) may always be known and constant for each configuration of the attenuator 220. For example, each step of the step attenuator 220 may have a known and constant delta for each step. While a step attenuator is described herein, several other methods may be available to implement the attenuator 220. Preferably, the loss or attenuator gain of the various configurations of the attenuator 220 may remain constant regardless of variables of the receiver 212 or environment in which the receiver 212 is disposed.

In some aspects, the attenuator 220 may comprise a single pole four throw (SP4T) switch. Accordingly, the single input pole (corresponding to the input signal of the attenuator 220) may be selectively split to one, two, three, or four ports, as desired. Thus, up to four potential configurations (or steps) may be available. As shown in FIGS. 3 and 4, the SP4T switch may be configured to provide two attenuation steps. Step 1 may have a gain G=−5 dB (corresponding to a loss L=5 dB or a noise figure F=5 dB). Thus, whenever step 1 is applied to the input signal of the attenuator 220, the noise of that signal may be reduced by 5 dB. Similarly, step 2 may have a gain G=−10 dB (corresponding to a loss L=10 dB or a noise figure F=10 dB). Thus, whenever step 2 is applied to the input signal of the attenuator 220, the noise of that signal may be reduced by 10 dB.

Thus, the attenuator 220 may attenuate the received signal at both the Step 1 and Step 2, corresponding to gains G=−5 dB and −10 dB, respectively. The output of the attenuator 220 is connected to the receiver amplifier 224, and the attenuated signals pass to the receiver amplifier 224.

The receiver amplifier 224 may receive the attenuated signals from the attenuator 220 and amplify them. For example, the receiver amplifier 224 may comprise a gain of G=25 dB and a noise figure of F=5 dB. However, in other aspects, the receiver amplifier 224 may have any other gain or noise figure values.

The amplified output from the receiver amplifier 224 may feed into one or more downstream components, for example the analog/digital converter (ADC) 226. In some other aspects, the ADC 226 may be replaced with a processor or power detector (or other similar structure, not shown) or any other component capable of comparing inputs or various other values. In some aspects, there may be one or more other components placed between the receiver amplifier 224 and the ADC 226. These other components are shown as block 312.

The block 312 may comprise any combination of filters, mixers, amplifiers, or other components that may improve receiver 212 performance. Regardless of this combination of components, the positioning of the attenuator 220 immediately after the LNA 218 allows for the individual calibration of the noise figure of the LNA 218 without interference from other components of the receiver 212. Similarly, each component of the receiver 212 may be independently calibrated using the attenuator 220 (or similar attenuator) placed immediately downstream of the component being calibrated in the receiver 212.

FIG. 3 also shows exemplary location 316 showing an example of a noise reading due to the different components in the system 300. For example, location 316 corresponds to a position downstream of the attenuator 220 but upstream from the receiver amplifier 224. Thus, as shown in FIG. 3, at the location 316, the noise of the signal having been amplified by the LNA 218 and having been attenuated by the attenuator 220 but not yet having been amplified by the receiver amplifier 224 is −56 dBm for the signal attenuated at the first step and is −61 dBm for the signal attenuated at the second step. The 5 dB difference corresponds to the known 5 dB difference between the first and second steps described above. Accordingly, location 316 may demonstrate noise contribution between the LNA 218 and the other components. The FIG. 3 also shows an example of a graph of noise values for the signal(s) from its receipt at the antenna 216 through processing at the ADC 226. As shown in FIG. 3, the signal as received by the antenna 216 may have a noise value of −81 dBm at the LNA 218 input, as shown at noise value 330. Accordingly, both noise levels 320 and 322 are shown overlapping at the noise value of −81 dBm. The two noise levels 320 and 322 may correspond to the values of noise from the LNA 218 input across the components of the system 300 as shown at two attenuation values (or Steps 1 and 2 above), 5 dB and 10 dB, respectively. Thus, as the signal has not passed through the attenuator 220, the two noise levels 320 and 322 overlap at the noise value 330 as the steps 1 and 2 have not yet been applied.

Noise levels 320 and 322 correspond to two measurements having only a difference of the attenuation level of the attenuator 220 between them. As the attenuator 220 has two steps having a difference of 5 dB between the steps, the difference between the noise levels 320 and 322 should be 5 dB. As described above, the noise level at the input of the attenuator 220 may be attenuated by the same amount depending only on the attenuator 220 attenuation step (e.g., attenuation level).

The noise as output by each component of the system 300 may comprise the sum of two separate noises: (1) thermal noise of the system 300 as input by the component and as amplified by the component's gain and own noise figure and (2) cumulative noise from the previous components of the system 300 amplified by the component's gain. The thermal noise of the system 300 (as measured in logarithmic units may be shown by Equation 1 below:

Thermal Noise [TN]=10*log 10($K*T*B$*1000)  (Equation 1-1)

Where:
K=Boltzmann Constant=1.38*10^−23
B=signal bandwidth in Hz
T=Temperature in Kelvin (K)

The value of the thermal noise as calculated by Equation 1 may be constant, depending only on variations in the temperature of the system 300 and the signal bandwidth. Assuming room temperature for the calculations contained herein, the temperature T may be 300K. Additionally, assuming a bandwidth of 1.76 GHz (or 1,760,000,000 Hz), Equation 1 provides a thermal noise value of −81 dBm.

Accordingly, each component of the system 300 may amplify the thermal noise of the system 300 (corresponding to the −81 dBm) by its own gain and noise figure. Additionally, noise calculations may vary for different components in the system 300. For example, the noise contribution of the first component in the system 300 (e.g., the LNA 218) may be calculated differently than the noise contributions of any of the downstream components (e.g., the attenuator 220), as shown below with regard to Equations (1-2) through (1-5).

Thus, noise of (1) [NoiseOut_1] for the first component (e.g., the component closest to the antenna 216 in the system 300) may correspond to:

In linear units, Watts (W): [NoiseOut_1]= $KTB*G1*F1$  (Equation 1-2)

In dBm: [NoiseOut_1]=10*log 10($KTB$*1000)+ 10*log 10($G1$)+10*log 10($F1$),  (Equation 1-3)

Where G1 and F1 correspond to the gain and noise figure of the first component.

The noise of (1) [NoiseOut_1] for the second (and any subsequent) component may correspond to:

In linear units, W: [NoiseOut_1]=$KTB*G*(F−1)$  (Equation 1-4)

In dBm: [NoiseOut_1]=10*log 10($KTB$*1000)+ 10*log 10($G$)+10*log 10($F$−1),  (Equation 1-5)

Where G and F correspond to the gain and noise figure, respectively, of each second (and subsequent) component.

The noise of (2) above may correspond to the noise at the component's input plus the component's gain. Thus, the noise of (2) [NoiseOut_2] may correspond to the NoiseIn+ G, where NoiseIn is equal to the noise received from the upstream component(s).

As with the definitions of NoiseOut_1 and NoiseOut_2 described above, the equation used to determine a total noise of each component may depend on whether the component is the first component in the system 300 or the second (or subsequent) component of the system 300. To calculate the total noise of the first component in the system 300, Equation 2-1 below may be used:

Total Noise Out (dB)=$KTB+G+F$  (Equation 2-1)

To calculate the total noise of each second (or subsequent) component, the NoiseOut_1 and the NoiseOut_2 of the component in question need to be summed. Such summing may comprise converting the logarithmic units to linear units using Equation 2-2 below:

Total Noise Out (mWatts)=10^(NoiseOut_1/10)+ 10^(NoiseOut_2/10)  (Equation 2-2)

Equation 2-3 below provides the total noise out in dBm:

10*log 10(Total Noise Out)  (Equation 2-3)

As an example of the application of Equations 1 and 2 above for the system 300 comprising the LNA 218, the attenuator 220, and the receiver amplifier 224. G1 and F1 may correspond to the gain and noise figure, respectively, of the LNA 218, while G2 and F2 are the gain and noise figure of the attenuator 220, and G3 and F3 are the gain and noise figure, respectively, of the receiver amplifier 224. Accordingly, at the output of the LNA 218, NoiseOut_1 (mW)= $KTB*G1*F1$ and the NoiseOut_1 [dBm]=10*log 10($KTB$*1000)+10*log 10(G1)+10*log 10(F1). Similarly, at the output of the attenuator 220, the NoiseOut_1 (mW)= $KTB*G2*(F2−1)$ and the NoiseOut_2 (mW)=$KTB*G1* F1*G2$, while NoiseOut_1 [dBm]=10*log 10($KTB$*1000)+ 10*log 10(G2)+10*log 10(F2−1) and the NoiseOut_2 [dBm]=10*log 10($KTB$*1000)+10*log 10(G1)+10*log 10(F1)+10*log 10(G2). The total noise at the output of the attenuator 220, following Equations 2 above, (mW)= NoiseOut_1 (mW)+NoiseOut_2 (mW)=$KTB*G1*F1*G2+ KTB*G2*(F2−1)=KTBG1G2(F1+(F2−1)/G1)=KTB* Gt*Ft$, where Gt=G1*G2 and Ft=F1+(F2−1)/G1. The total noise at the output of the receiver amplifier 224 may be similarly calculated. The NoiseOut_1 (mW) may equal $KTB*G3*(F3−1)$. Similarly, the NoiseOut_1 (dBm) may equal 10*log 10($KTB$*1000)+10*log 10(G3)+10*log 10(F3−1). The NoiseOut_2 (mW) equals $KTB*G1* F1*G2*G3+KTB*G2*(F2−1)*G3$, and the total noise at the output of the receiver amplifier 224 (mW) is NoiseOut_1 (mW)+NoiseOut_2 (mW), or $KTB*G1*F1*G2*G3+ KTB*G2*(F2−1)*G3+KTB*G3*(F3−1)$. This simplifies to $KTB*G1*G2*G3*(F1+(F2−1)/G1+(F3−1)/G1*G2))$, or $KTB*Gt*Ft$, where Gt=G1*G2*G3 and Ft=F1+(F2−1)/G1+ (F3−1)/G1*G2.

The calculation of NoiseOut_1 may result in the noise level 324 (described below and illustrated in FIG. 3), corresponding to the thermal system noise affected only by the single component (the receiver amplifier 224). The calculation of NoiseOut_2 may result in the noise levels 320 and 322 (see FIG. 3), as these lines show the effect of each component on its respective input noise. The total noise out may correspond to the noise levels 326 and 328 (see FIG. 3) as calculated for the NoiseOut_2 calculations of noise levels 320 and 322. In other words, the total noise out may exist for each of the attenuated signals as generated by the attenuator 220.

At the LNA 218, as discussed above, the gain of the received signal is increased with a low increase in the noise of the signal, corresponding to the high gain-low noise relationship of the LNA 218. The higher the gain of the LNA 218 relative to the other components of the system 300, the higher the LNA 218 contribution to the total noise figure of the system. Equation 3 below provides an example of a cascaded noise figure which may apply to a sequence of components of the system 300:

$$F = F_1 + \frac{F_2 - 1}{G_1} + \frac{F_3 - 1}{G_1 G_2} + \frac{F_4 - 1}{G_1 G_2 G_3} + \ldots + \frac{F_n - 1}{G_1 G_2 G_3 \ldots G_{n-1}}, \quad \text{(Equation 3)}$$

The values $F_1$ and $G_1$ may correspond to the gain and noise figure of the first component in the system 300 (e.g., the LNA 218). Equation 3 may account for the gain and noise figure values for each component in the system 300, with $F_n$ and $G_n$ corresponding to the final components of the system 300 (e.g., the ADC 226). As seen from Equation 3, the LNA 218 may maintain both a low noise figure and sufficient gain to make its low noise figure dominant in the total gain of all the components of the system 300. When part of a system 300, the LNA 218 has a noise figure that is approximately equal to the full system 300 noise figure. By adjusting a current of the LNA 218, the LNA 218 may be controlled to have the exact gain required to maintain the system 300 total noise figure at its optimal value (e.g., the LNA 218 noise figure value). Thus, when the signal passes through the LNA 218, the noise of the received signal increases to −51 dBm, as shown by the graph portion of FIG. 3 (e.g., the resulting noise after passing through the LNA 218 is −81 dBm+25 dB (G)+5 dB (F)=−51 dBm). As the signals have not yet been attenuated by the attenuator 220, noise levels 320 and 322 remain overlapping at noise value 332 (e.g., −51 dBm). The noise levels 320 and 322 remain at the noise value 332 until the signal reaches the attenuator 220.

At the attenuator 220, the noise of the signal is reduced. However, as shown in FIG. 3, the attenuator 220 applies two different levels of attenuation to the input signal according to the two different steps described above (the 5 dB and 10 dB amounts discussed above). The attenuator 220 reduces the noise of the signal by a first amount of 5 dB (generating the noise level 320) and reduces the noise of the signal by a second amount of 10 dB (generating the noise level 322). Thus, as shown, the noise levels 320 and 322 diverge at the attenuator 220.

The noise levels 320 and 322 may correspond to only the NoiseOut_2 values at the output of the attenuator 220. However, as described above, the total noise output of the attenuator 220 may include the NoiseOut_1 of the attenuator 220. In some aspects, the NoiseOut_1 of the attenuator 220 may be ignored as being negligible.

For example, the noise level 320 is shown reducing to a value of approximately −56 dBm at a noise value 334 (corresponding to the −81 dBm+25 dB+5 dB−5 dB). However, the level of the NoiseOut_1 at the output of the attenuator 220 may be neglected because its value, in linear units, is (KTB*G*(F−1)): 10*log 10(KTB*1000*10^(−5/10))*(10^(5/10)−1))=−82.6 dBm. Because the NoiseOut_2 of the attenuator 220 at approximately −56 dBm is more than 16 dB higher than the NoiseOut_1 at approximately −82.6 dBm, the total noise of the attenuator 220 may be approximately −56 dBm based on the NoiseOut_2 and ignoring the NoiseOut_1 (the actual total noise being 10*log 10(10^(−56/10)+10^(−82.6/10))=−55.9905 [dBm]).

Similarly, the noise level 322 is shown reducing to a value of approximately −61 dBm at a noise value 336 (corresponding to the −81 dBm+25 dB+5 dB−10 dB), where the NoiseOut_1 may be neglected when its value for the 10 dB attenuation is 10*log 10(KTB*1000*10^(−10/10)*(10^(10/10)−1)=−81.45 dBm. Because the −61 dBm NoiseOut_2 level is more than 16 dB higher than the −81.45 dBm NoiseOut_1 level, the NoiseOut_1 may be ignored, making the total actual noise approximately −61 dBm. In general, anytime NoiseOut_2 is more than 16 dB greater than NoiseOut_1, the contribution of NoiseOut_1 to the total noise is less than 0.1 dB. Accordingly, NoiseOut_1 may be neglected from the determination of the total noise.

Thus, at the output of the attenuator 220, the noise levels 320 and 322 are shown having a noise difference of 5 dB (corresponding to the noise delta of the steps 1 and 2). This difference is indicated by the gap 350 between the noise levels 320 and 322. This 5 dB noise difference may be shown at location 316 prior to being amplified by the receiver amplifier 224. At location 316 (attenuator output) the noise delta of the noise levels 320 and 322 is known. Thus, the 5 dB noise difference at location 316 may correspond to the total noise delta as known.

The receiver amplifier 224 may also introduce noise due to the amplification process it performs. An example of the thermal noise of the system 300 as affected by the receiver amplifier 224 is shown by the noise level 324. The noise level 324 corresponds to the contribution of noise from the receiver amplifier 224 to the thermal noise of the system 300. As shown by the noise values 330 and 346, the thermal noise of the system 300 is −81 dBm (as calculated by Equation 1 above). Based on Equation 1 described above, the thermal noise output NoiseOut_1 of the receiver amplifier 224 is −81+10*log 10(G*(F−1)), where G[dB]=25, G[dBm]=10^(25/10) and F[dB]=5, F[dBm]=10^(5/10), and F−1=10^(5/10)−1. Accordingly, the output NoiseOut_1 of the receiver amplifier 224 is approximately −81+10*log 10(10^(25/10)*(10^(5/10)−1))=−52.6509 dBm.

The noise levels 320 and 322 at the input of the receiver amplifier 224 are amplified by the receiver amplifier 224 to output NoiseOut_2 (corresponding to −56 dBm+25 dB=−31 dBm and −61 dBm+25 dB=−36 dBm (corresponding to noise values 338 and 340)).

Block 312, as described above, may comprise one or more additional components of the system 300. Accordingly, the graph portion of FIG. 3 shows no corresponding changes to the noise between the receiver amplifier 224 and the ADC 226.

At the ADC 226, the noise levels 326 and 328 are measured and compared. In some aspects, the noise levels 326 and 328 (and corresponding differences) are only measured at the ADC 226. The ADC 226 is used to determine whether or not the noise delta (e.g., the 5 dB gap as shown in FIGS. 3 and 4 as an example) is maintained along the chain of components of the system 300 through to the ADC 226. at ADC 226, the noise delta between the noise levels 326 and 328 (i.e., gap 354) is measured and compared to the known noise delta between the noise levels 320 and 322 (i.e., gap 350) which is known at location 316, as described above.

If the LNA 218 gain is sufficient, the noise delta at the ADC 226 equals the noise delta at location 316. The LNA 218 gain may be increased if the noise delta at ADC 226 is lower than the known noise delta at location 316 (as seen in FIG. 3 below), it means by increasing of the LNA 218.

In some aspect, the ADC 226 may be replaced with another component configured to measure and compare noise values of the received signals. For example, the measured noise levels of the signal received at the input of the ADC 226 may be represented by noise levels 326 and 328, respectively. The noise levels 326 and 328 may comprise the summation of (1) the noise from the receiver amplifier 224 as applied to the thermal noise of the system 300 and (2) the noise from the receiver amplifier 224 as applied to the noise received from the attenuator 220. The ADC 226 measures the difference between the two noise levels 326 and 328. If the difference between the two measurements is the same as the attenuator step, then the noise of the receiver amplifier is negligible (as described above), and the current of the LNA 218 need not be adjusted (current does not need to be added to the LNA 218). The desired difference between the noise levels 326 and 328 (the desired difference corresponding to the difference between the noise values 338 and 340) is known because the attenuator delta of the attenuator 220 is known (e.g., 5 dB and 10 dB steps, so delta is 5 dB).

For example, the noise level 320 may be a theoretical or expected noise value 338 (−31 dBm) of the signal received by the ADC 226 while the noise level 326 may correspond to the noise level measured by the ADC 226 as having a noise value of −30.96 dBm (corresponding to noise value 342). Similarly, the noise level 322 may be the theoretical or expected noise value 340 (−36 dBm) of the signal received by the ADC 226 while the noise level 328 may correspond to the noise level measured by the ADC 226 as having a noise value of −35.9 dBm (corresponding to noise value 344). If the noise difference as measured at the ADC 226 is the same as the difference in the values applied to the signal at the attenuator 220, then the current of the LNA 218 need not be adjusted (e.g., the LNA 218 is properly calibrated).

The total noise as measured and calculated by the ADC 226 may be found by summing the NoiseOut_1 and NoiseOut_2 of the receiver amplifier 224 for each of the attenuated step values. NoiseOut_1 at 5 dB step is [−52.6 dBm, while the NoiseOut_2 is −31 dBm at 5 dB step. The NoiseOut_1 at 10 dB step is still −52.6 dBm, while the NoiseOut_2 is −36 dBm. Using Equations 2 above, the contribution of receiver amplifier 224 alone to the total noise is negligible at 0.04 dB (Total Noise Out @ 5 dB step=−30.96 dBm, while NoiseOut_2=−31 dBm) and 0.1 dB (Total Noise Out @ 10 dB step=−35.9 dBm, while NoiseOut_2=−36 dBm). The total noise out values may correspond to a "healthy" state, where the gain delta at as calculated by the ADC 226 remains nearly 5 dB (−30.96 dBm to −35.9 dBm) as compared to (−31 dBm to −36 dBm).

In some embodiments, there may be a tradeoff between the adjustment of the noise delta and the power consumption at the LNA 218. For example, dependent upon the noise delta, correcting a small degradation in noise delta may require a commensurately large power expenditure. Thus, achieving a noise delta comparison of zero may be inefficient. For example, if the measured noise delta is 4.9 dB while the known noise delta is 5 dB (e.g., the noise figure is degraded by only 0.1 dB), although increasing the LNA 218 current would lower this delta, the resulting decrease may be relatively small while consuming a significantly higher amount of power. Accordingly, a target final value of the LNA 218 current may still result in a difference between the known noise delta and the noise delta measured by the ADC 226. The difference may be within a specified threshold, such as a percentage or dB amount, etc.

In some aspects, the threshold or desired or acceptable difference between the noise deltas may be dependent upon an application of the system 300. For example, in applications where power is stored in limited quantities (e.g., technologies sourcing power from a limited supply or battery), the threshold for the difference between the noise deltas may be greater than in applications where power is sourced from a (e.g., acceptable noise delta of 0.5 dB in mobile applications whereas the acceptable noise delta is 0.1 dB in non-mobile applications). Thus, performance may be compromised in favor of extended power for limited power applications. In some aspects, the threshold may determine how long the current of the LNA 218 is adjusted. For example, the current of the LNA 218 may be adjusted until the difference between the measured noise delta (corresponding to gap 354) and the known noise delta (corresponding to gap 350) is less than the threshold value. For example if the threshold is 0.1 dB and known noise delta is 5 dB, calibration (e.g., adjustment of the LNA 218 current) may end when the measured noise delta is equal to or above 4.9 dB. Thus, the power consumption and performance may be balanced dependent upon the application of the system 300.

As shown in the FIG. 3, the measured difference of noise levels 326 and 328 as measured by the ADC 226 is 4.94 dB. Accordingly, the ADC 226 confirms that the noise difference between the two noise levels 326 and 328 is substantially the same as the noise delta between the noise levels 320 and 322. Accordingly, this shows that the noise is maintained through the components of the system 300 (e.g., the components do not greatly affect the noise of the system 300). If the measured values (e.g., noise levels 326 and 328) are within a threshold percentage of the attenuator 220 attenuation difference (e.g., difference between 10 dB and 5 dB), then calibration need not be performed.

FIG. 4 illustrates the system 400, corresponding to the system 300 of FIG. 3. The system 400 has the same components and structure as system 300, but where further adjustment of the calibration of the system 400 is performed based on different conditions to which the system 400 is exposed. A graph of the noise as introduced by a received signal and influenced by components of the system 400 and the conditions to which the system 400 is exposed is also shown in FIG. 4. The systems 300 and 400 comprise the same components for each of the FIGS. 3 and 4, respectively. However, the system 300 in FIG. 3 (and its components) may be subjected to different conditions (e.g., environmental conditions, thermal conditions, external conditions, etc.) as compared to the system 400 in FIG. 4.

As seen when comparing FIG. 3 and FIG. 4, the noise levels change, as well as the gain and noise figure values of the components of system 400. For example, in FIG. 3, the LNA 218 has a gain G=25 dB and a noise figure F=5 dB, but in FIG. 4, the LNA 218 has a gain G=8 dB and a noise figure F=7 dB. Accordingly, the system 400 as shown in FIG. 4 may correspond to a state during which noise figure calibration may be necessary according to the discussion below. The FIGS. 3 and 4 may correspond to different states of similar systems. FIG. 3 may depict a state of the system 300 where further adjustment of the calibration of the system 300 is not necessary while further adjustment of the calibration of the system 400 may be necessary during the state shown in FIG. 4.

The system 400 includes the antenna 216 that may be configured to receive or transmit a signal. The antenna 216 may be coupled to the LNA 218. The properties of the antenna 216 of FIG. 4 are similar as those of the antenna 216 of FIG. 3, and will not be described again here.

The LNA 218 may comprise a gain G=8 dB and a noise figure F=7 dB. The LNA 218 may then feed the received signal to an attenuator 220. The properties of the LNA 218 of FIG. 4 are similar as those of the LNA 218 of FIG. 3, and will not be described again here.

The attenuator 220, as described above, may be configured to attenuate the signal received from the LNA 218. The attenuator 220 may be configured attenuate the received signal at variable amounts (e.g., different steps, etc.). The properties of the variable attenuator 220 of FIG. 4 are similar as those of the variable attenuator 220 of FIG. 3, and will not be described again here.

As discussed above, the attenuator 220 may comprise a SP4T switch, which may be configured to provide two attenuation steps. Step 1 may have a gain G=−5 dB (corresponding to a loss L=5 dB or a noise figure F=5 dB). Thus, whenever step 1 is applied to the input signal of the attenuator 220, the noise of that signal may be reduced by 5 dB. Similarly, step 2 may have a gain G=−10 dB (corresponding to a loss L=10 dB or a noise figure F=10 dB). Thus, whenever step 2 is applied to the input signal of the attenuator 220, the noise of that signal may be reduced by 10 dB. The output of the variable attenuator 220 is connected to the receiver amplifier 224. The receiver amplifier 224 may receive signals from the variable attenuator 220 and amplify them. The receiver amplifier 224 may comprise a gain of G=25 dB and a noise figure or factor of F=5 dB.

The amplified output from the receiver amplifier 224 may feed into one or more downstream components, for example the analog/digital converter (ADC) 226. In some other aspects, the ADC 226 may be replaced with a processor or similar device, not shown) or any other component capable of comparing inputs or various other values. In some aspects, there may be one or more other components placed between the receiver amplifier 224 and the ADC 226. These other components are shown as block 412. The block 412 may comprise any combination of filters, mixers, amplifiers, or other components that may be required for system 400 receiver 212 performance. Regardless of this combination of components, the positioning of the attenuator 220 immediately after the LNA 218 allows for the individual calibration of the noise figure of the LNA 218 without interference from other components of the system 400. Similarly, each component of the system 400 may be independently calibrated using the attenuator 220 (or similar attenuator) placed immediately downstream of the component being calibrated in the system 400.

The system 400 also shows a location 416 showing an example of noise figure differences due to the different components in the system 400. For example, location 416 corresponds to a position downstream of the attenuator 220 but upstream from the receiver amplifier 224. Thus, as shown in FIG. 4, at location 416, the noise portion NoiseOut_2 of the signal having been amplified by the LNA 218 and having been attenuated by the variable attenuator 220 but not yet having been amplified by the receiver amplifier 224 is −71 dBm for the signal attenuated at the first step and is −76 dBm for the signal attenuated at the second step. The FIG. 4 also shows an example of a graph of noise values for the signal(s) from its receipt at the antenna 216 through processing at the ADC 226. As shown in FIG. 4, the signal as received by the antenna 216 may have a noise level of −81 dBm at the LNA 218 input, as shown at value 430. Accordingly, both noise levels 420 and 422 are shown overlapping at the noise level of −81 dBm. The two noise levels 420 and 422 may correspond to the levels of noise from the LNA 218 input across the components of the system 400 as shown at two attenuation levels, 5 dB (Step 2) and 10 dB (Step 1), respectively. Thus, as the signal has not passed through the attenuator 220, the two noise levels 420 and 422 overlap at value 430 as the steps 1 and 2 have not yet been applied.

Noise levels 420 and 422 correspond to two signal noise levels having only a difference of the attenuation level of the attenuator 220 between them. As the attenuator 220 has two steps having a difference of 5 dB between the steps, the difference between the noise levels 420 and 422 should be 5 dB. As described above, the noise level at the input of the attenuator 220 may be attenuated by the same amount depending only on the attenuator 220 attenuation step (e.g., attenuation level).

The noise as output by each component of the system 400 downstream from the LNA 218 may comprise the sum of the two separate noises described above: (1) thermal noise of the system 400 as input by the component and as amplified by the component's gain and own noise figure and (2) cumulative noise from the previous components of the system 400 amplified by the component's gain. Based on Equations 1 and 2 above, the calculation of NoiseOut_1 may result in the noise level 424 (described below and illustrated in FIG. 4), corresponding to the thermal noise of the system noise affected only by the single component (the receiver amplifier 224). The calculation of NoiseOut_2 may result in the noise levels 420 and 422 (see FIG. 4), as these lines show the effect of each component on its respective input noise.

At the LNA 218, as discussed above, the gain of the received signal is increased with a lower increase in the noise of the signal as compared to the LNA of FIG. 3, corresponding with a worse high gain-low noise relationship of the LNA 218 than that of the LNA of FIG. 3. The combination of gain and noise figure of the LNA 218 of FIG. 4 would result in degraded performance of the system 400 when compared to the system 300 of FIG. 3. This LNA 218 does not have enough gain, and as a result, the noise contribution of the subsequent components of the system 400 becomes dominant (as can be seen by Equation 3 above).

When the signal passes through the LNA 218, the noise of the received signal increases to −66 dBm, as shown by the graph portion of FIG. 4 (e.g., the resulting noise after passing through the LNA 218 is −81 dBm+8 dB (G)+7 dB (F)=−66 dBm). As the signals have not yet been attenuated by the attenuator 220, noise levels 420 and 422 remain overlapping at noise value 432 (e.g., −66 dBm). The noise levels 420 and 422 remain at the noise value 432 until the signal reaches the attenuator 220.

As shown in FIG. 4, the attenuator 220 applies two different levels of attenuation to the input signal according to the two different steps described above (the 5 dB and 10 dB amounts discussed above). The attenuator 220 reduces the noise of the signal by a first amount of 5 dB (generating the noise level 420) and reduces the noise of the signal by a second amount of 10 dB (generating the noise level 422). Thus, as shown, the noise levels 420 and 422 diverge at the attenuator 220. The noise level 420 is shown reducing to a value of −71 dBm at a noise value 434 (−81 dBm+8 dB+7 dB−5 dB), while the noise level 422 is shown reducing to a value of −76 dBm at a noise value 436 (−81 dBm+8 dB+7 dB−10 dB). Thus, at the output of the attenuator 220, the noise levels 420 and 422 are shown having a noise difference of 5 dB (corresponding to the noise delta of the steps 1 and 2). This difference is indicated by the gap 450 between noise levels 420 and 422. This noise difference may be shown at location 416 prior to being amplified by the receiver amplifier 224. At location 416 (attenuator output), the noise delta of the noise levels 420 and 422 is known.

In some aspects, the noise signals of the noise levels 420 and 422 shown at the output of the attenuator 220 may represent only the NoiseOut_2 of the attenuator 220. However, the total noise at the output of attenuator 220 includes the summation of both the NoiseOut_1 and NoiseOut_2. Unlike the system 300 of FIG. 3, the attenuator 220 noise contribution to the total noise cannot be neglected in this case. At the output of the attenuator 220, for the 5 dB attenuation step, NoiseOut_1=−81+10*log 10(10^(−5/10)*(10^(5/10)−1))=−82.6509 dBm, while the total noise= NoiseOut_1+NoiseOut_2=10*log 10(10^(−82.6509/10)+10^(−71/10))=−70.7 dBm at the attenuator 220 output with 5 dB attenuation step. For the 10 dB attenuation, the NoiseOut_1=−81+10*log 10(10^(−10/10)*(10^(10/10)−1))=−81.46 dBm, while the total noise at the attenuator 220 output with the 10 dB attenuation step is equal to the sum of the NoiseOut_1 and the NoiseOut_2, corresponding to 10*log 10(10^(−81.46/10)+10^(−76/10)), or −74.9 dBm. Accordingly, the total noise difference at the attenuator 220 output is −70.7 dBm−(−74.9 dBm), or 4.2 dB.

As noted above, FIG. 4 only depicts the NoiseOut_2 of the receiver amplifier 224 and the NoiseOut_2 of the attenuator 220; the NoiseOut_1 of the attenuator 220 is not shown, while the NoiseOut_2 of the receiver amplifier 224 is shown. Similarly, the noise outputs of the subsequent components (e.g., the receiver amplifier 224 and the block 412) shown in FIG. 4 also correspond to only the NoiseOut_2 of those components. However, these NoiseOut_2 values cannot ignore the NoiseOut_1, as done in FIG. 3. This is because the NoiseOut_2 of the components of FIG. 4 are less than 16 dB greater than the NoiseOut_1 of the corresponding components, the contribution of NoiseOut_1 to the total noise is greater than 0.1 dB. Accordingly, NoiseOut_1 may not be neglected from the determination of the total noise of the corresponding components.

The receiver amplifier 224 may introduce noise due to the amplification process it performs. An example of the thermal noise of the system 400 as affected by the receiver amplifier 224 is shown by the noise level 424. The noise level 424 corresponds to the contribution of noise from the receiver amplifier 224 to the thermal noise of the system 400. As shown by noise values 430 and 446, the thermal noise of the system 400 is −81 dBm (as calculated by Equation 1 above). Based on the equations described above, the noise output NoiseOut_2 of the receiver amplifier 224 at the 5 dB attenuation step is the total noise out of attenuator 220 plus the gain of the receiver amplifier 224. Thus, the NoiseOut_2 is equal to −70.7 (attenuator 220 total noise out)+25 dB (gain of receiver amplifier 224), or −45.7 dBm. Similarly, the noise output NoiseOut_2 of the receiver amplifier 224 at the 10 dB attenuation step is the total noise out of attenuator 220 plus the gain of the receiver amplifier 224. Thus, the NoiseOut_2 is equal to −74.9 dBm (attenuator 220 total noise out)+25 dB (gain of receiver amplifier 224), or −49.9 dBm. The noise levels 420 and 422 at the input of the receiver amplifier 224 are amplified by the receiver amplifier 224 to output the NoiseOut_2 values corresponding to noise values 438 and 440, respectively. The total noise out may correspond to the noise levels 426 and 428 as calculated for the NoiseOut_2 calculations of noise levels 420 and 422. In other words, the total noise out may exist for each of the attenuated signals as generated by the attenuator 220)).

Block 412, as described above, may comprise one or more additional components of the system 400. Accordingly, the graph portion of FIG. 4 shows no corresponding changes to the noise between the receiver amplifier 224 and the ADC 226.

At the ADC 226, the noise levels 426 and 428 are measured and compared. In some aspects, the noise levels 426 and 428 (and corresponding difference) are only measured at the ADC 226. The ADC 226 is used to determine whether or not the noise delta (e.g., the 5 dB gap as shown in FIGS. 3 and 4 as an example) is maintained along the chain of components of the system 400 through to the ADC 226. Accordingly, at ADC 226, the noise delta between the noise levels 426 and 428 is measured and compared to the known noise delta between the noise levels 420 and 422. When the LNA 218 gain is properly calibrated, the noise delta between the noise levels 426 and 428 at the ADC 226 equals the noise delta of the known noise levels 420 and 422 at the location 416. As discussed above, the noise delta between noise levels 420 and 422 corresponds to the noise delta between the Step 1 and Step 2 of the attenuator 220. When the noise delta between the noise levels 426 and 428 at the ADC 226 is lower than the noise delta of the noise levels 420 and 422 at the locations 416, system 400 is not properly calibrated. Accordingly, in some aspects, to bring the system 400 to proper calibration, the LNA 218 gain may be increased.

In some aspect, the ADC 226 may be replaced with another component configured to measure and compare noise values of the received signals. For example, the measured noise values of the two noise levels 420 and 422 may be represented by noise levels 426 and 428, respectively. The noise levels 426 and 428 may comprise the summation of (1) the noise from the receiver amplifier 224 as applied to the thermal noise of the system 400 and (2) the receiver amplifier 224 as applied to the noise received from the attenuator 220. The ADC 226 measures the difference between the two noise levels 426 and 428. If the difference between the two noise levels is not substantially the same as the attenuator step, then the noise of the receiver amplifier is not negligible, and calibration may be needed to adjust the current of the LNA 218 (e.g., current may need to be added to the LNA 218).

The total noise as measured and calculated by the ADC 226 may be found by summing the NoiseOut_1 and NoiseOut_2 of the receiver amplifier 224 for each of the attenuated step values. The NoiseOut_1 at 5 dB step is −52.6 dBm, while the NoiseOut_2 is −45.7 dBm at 5 dB step. The NoiseOut_1 at 10 dB step is still −52.6 dBm, while the NoiseOut_2 is −49.9 dBm at 10 dB step. Using Equations 2 above, the contribution of receiver amplifier 224 alone to the total noise is not negligible, resulting in a difference of 3.1 dB (Total Noise Out @ 5 dB step=−44.89 dBm, while NoiseOut_2=−−45.7 dBm) (Total Noise Out @ 10 dB step=−48 dBm, while NoiseOut_2=−49.9 dBm). This total noise corresponds to a state where the gain delta as calculated by the ADC 226 does not match the known gain delta of the attenuator 220.

When the measured noise values at the ADC 226 match the noise difference between steps 1 and 2 of the attenuator 220 (e.g., noise levels 426 and 428) are outside a threshold (e.g., difference between 10 dB and 5 dB), then calibration may need to be performed. In certain aspects, the threshold may be measured in decibels. In some aspects, the threshold may be measured in percentage.

Based on the discussion above, (e.g., the signal attenuation at varying gains and the measurement of the noise of the attenuated signals), the system 400 may be configured to calibrate itself with regard to its noise figure/factor and current consumption without the use of any external measurement tools or devices and without any complex process materials. Accordingly, the system 400 may be configured to perform online calibration any time while in operation. Based on the measured values (e.g., noise levels 426 and 428), the ADC 226 may determine if current is to be added at the LNA.

The current of the LNA 218 may be increased incrementally until both of the noise measurements at the ADC 226 of two outputs of the attenuator 220 give the difference in noise which is substantially the same as the difference between the gains of the attenuator 220 steps. For example, as described above, the difference in steps of the attenuator (e.g., difference in gains for different attenuated signals) is 5 dB. Once the difference in the measured noise values is substantially the same as the difference in attenuator steps (e.g., gain at the attenuated signals), then the system is calibrated and no additional currents needs to be added to the LNA 218. "Substantially the same" may comprise the delta between measured difference and attenuator steps being within a threshold range (e.g., 0.1 dB, 0.2 dB, 0.5 dB, or measured in percent difference, etc.) and may be established based on the type of communications involved or the application of the system. The measurements of FIG. 4 show an aspect when there is insufficient current at the LNA 218 for the measured noise levels to match the attenuator step gains. For example, as described above, the difference between the 420 and 422 noise levels at the attenuator and the 426 and 428 noise levels as measured by the ADC 226 are not the same (e.g., 5 dB at the attenuator but only 3.1 dB at the ADC 226). This difference may indicate that current needs to be added to the LNA 218. The measured value may not exactly match the attenuator step gain difference, but the differences should be similar. The attenuator step values of 5 dB and 10 dB may be known as the attenuator may be configured to have attenuator steps that are constant in temperature, current, and process material.

Thus, the current of the LNA 218 may be incrementally adjusted. In some aspects, during adjustment of the current of the LNA 218, a margin of difference between the measured difference at the ADC 226 and the attenuator step at the attenuator 220 may reach a constant where an increase of current at the LNA 218 does not reduce the margin of difference. Accordingly, the current in the LNA 218 is increased until the measured difference between the noise levels 426 and 428 is substantially similar to the 5 dB step of the attenuator 220 or until the margin of difference reaches a constant. When the margin of difference reaches a constant, the system 400 identifies that the difference in the measured values is no longer changing, and identifies this margin of difference as the constant difference which cannot be reduced. Accordingly, the system 400 may stop adjusting the current of the LNA 218.

Figure 5:
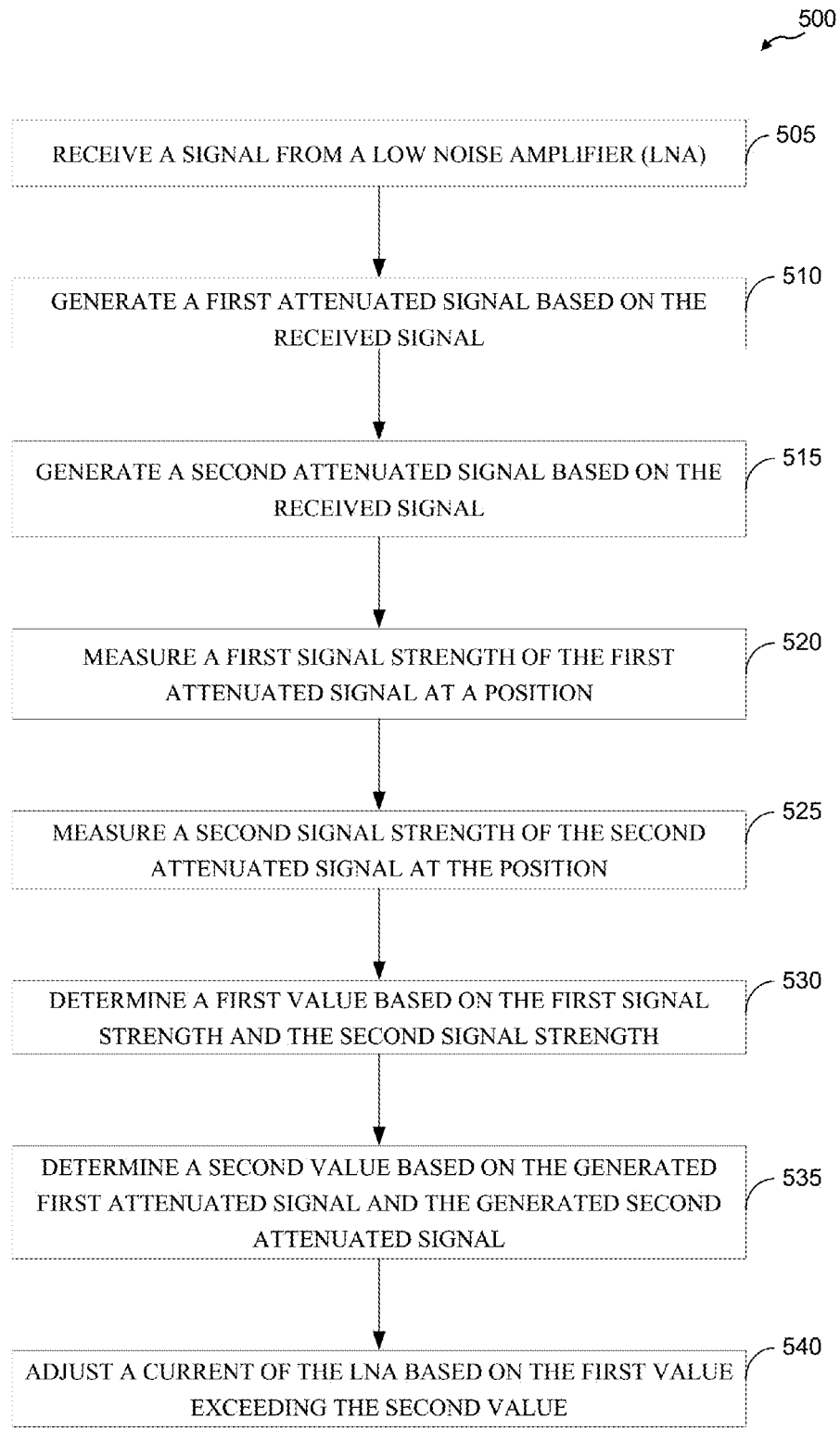
FIG. 5 is a flowchart of a method for calibrating the noise figure of the system in relation to FIGS. 3-4.

FIG. 5 is a process flow diagram of an exemplary method 1200 for wireless communication, in accordance with certain aspects of the present disclosure in relation to FIGS. 3 and 4. Method 500 may be performed by the device 202 (FIG. 2) in some aspects. The method 500 may also be performed by the AP 105 or STAs 110 shown in FIG. 1; a person having ordinary skill in the art will appreciate that the method 500 may be implemented by other suitable devices and systems. Although the method 500 is described herein with reference to a particular order, in various embodiments, blocks herein may be performed in a different order, or omitted, and additional blocks may be added.

Operation block 505 includes receiving a signal from a low noise amplifier (LNA). Operation block 510 includes generating a first attenuated signal based on the received signal. Operation block 515 includes generating a second attenuated signal based on the received signal. Operation block 520 includes measuring a first signal strength of the first attenuated signal at a position. Operation block 525 includes measuring a second signal strength of the second attenuated signal at the position. Operation block 530 includes determining a first value based on the first signal strength and the second signal strength. Operation block 535 includes determining a second value based on the generated first attenuated signal and the generated second attenuated signal. Operation block 540 includes adjusting a current of the LNA based on the first value exceeding the second value.

In some embodiments, an apparatus for wireless communication may perform one or more of the functions of method 500, in accordance with certain embodiments described herein. The apparatus may comprise means for means for receiving a signal. In certain embodiments, the means for receiving can be implemented by the receiver 212, the processor 204, the antenna 216, or the attenuator 220 (FIG. 2). In certain selecting, the means for receiving can be configured to perform the functions of block 505 (FIG. 5). The apparatus may comprise means for generating a first attenuated signal based on the received signal. In certain embodiments, the means for generating the first attenuated signal can be implemented by the receiver 212, the processor 204, or the attenuator 220 (FIG. 2). In certain embodiments, the means for generating the first attenuated signal can be configured to perform the functions of block 510 (FIG. 5).

The apparatus may further comprise means for generating a second attenuated signal based on the received signal. In certain embodiments, the means for generating the second attenuated signal can be implemented by the receiver 212, the processor 204, or the attenuator 220 (FIG. 2). In certain embodiments, the means for generating the second attenuated signal can be configured to perform the functions of block 515 (FIG. 5). The apparatus may further comprise means for measuring a first signal strength of the first attenuated signal at a position. In certain embodiments, the means for measuring the first signal strength can be implemented by the receiver 212, the processor 204, or the ADC 226 (FIG. 2). In certain embodiments, the means for measuring the first attenuated signal can be configured to perform the functions of block 520 (FIG. 5).

The apparatus may further comprise means for measuring a second signal strength of the second attenuated signal at the position. In certain embodiments, the means for measuring the second signal strength can be implemented by the receiver 212, the processor 204, or the ADC 226 (FIG. 2). In certain embodiments, the means for measuring the second signal strength can be configured to perform the functions of block 525 (FIG. 5). The apparatus may further comprise means for determining a first value based on the first signal strength and the second signal strength. In certain embodiments, the means for determining the first value can be implemented by the receiver 212, the processor 204, the attenuator 220, or the ADC 226 (FIG. 2). In certain embodiments, the means for determining the first value can be configured to perform the functions of block 530 (FIG. 5).

The apparatus may further comprise means for determining a second value based on the generated first attenuated signal and the generated second attenuated signal. In certain embodiments, the means for determining the second value can be implemented by the receiver 212, the processor 204, the attenuator 220, or the ADC 226 (FIG. 2). In certain embodiments, the means for determining the second value can be configured to perform the functions of block 535 (FIG. 5). The apparatus may further comprise means for adjusting a current of the LNA if the first value exceeds the second value. In certain embodiments, the means for adjusting can be implemented by the receiver 212, the processor 204, or the attenuator 220. In certain embodiments, the means for adjusting can be configured to perform the functions of block 540 (FIG. 5).

Manufacturing of silicon chips used for various components of the systems 300 and 400 may utilize different processes. Accordingly, there could be differences in the exact material parameters between produced chips. These differences may be divided into different process types. All chips from the same process type may have similar parameters. For example, the LNA 218 manufactured according to one process type could have G=22, F=5, while the same LNA 218 design manufactured according to another process type could have G=18, F=6, etc.). As described herein, regardless of the production process, the attenuator attenuation on each attenuation step remains constant. This may be achieved in several ways, for example, by using the SP4T switch described above.

One benefit of an aspect of calibrating a noise figure or factor of a system (such as the system 300) as disclosed above is that absolute gain or absolute noise figure is not measured. Instead, measurements are taken within the system 300 and are relative to other measurements and components of the system 300. Additionally, a temperature of the system 300 or components of the system 300 need not be determined, while the attenuation steps of the attenuator 220 may be known. Additionally, the noise figure calibration as described above may be simpler, quicker, and cheaper than current methods of calibrating noise figures, and the system 300 may be configured to self-calibrate without any external measurements (e.g., measurements for external devices or monitors, etc.). Furthermore, the self-calibration may be performed while the system 300 is online. Accordingly, the self-calibration may allow for the avoidance of excessive currents (e.g., where current levels are increased such that energy is lost to thermal waste) and insufficient current levels (e.g., where the current levels are insufficient to minimize noise figure degradation.

Such self-calibration processes may be applicable in 60 GHz system because the 60 GHz systems may involve large fluctuations of temperature and process material. High temperatures in operation may suggest consumption of too much current and may cause overheating, which may be disrupting to accurate signal processing and may shorten the lifespan of components that overheat. Based on the large temperature fluctuations, establishing a set of current values for the LNA 218 that fits the range of temperatures and process materials in advance may not be feasible, thus making calibration useful. As calibrating noise figure may be made difficult due to difficulties in measuring noise figures and due to the process materials and equipment used, the self-calibration described above may be greatly simplified over existing calibration methods and may allow for the calibration of various 60 GHz systems.

While the discussion above focuses on an increase if temperature, etc., which results in the need to calibrate the noise figure, the same processes and discussions may apply where the temperature, etc., decreases. Accordingly, the discussion herein may apply to any fluctuations in temperature, current, voltage, etc., of the components of the systems used in wireless communications.

As used herein, the term interface may refer to hardware or software configured to connect two or more devices together. For example, an interface may be a part of a processor or a bus and may be configured to allow communication of information or data between the devices. The interface may be integrated into a chip or other device. For example, in some aspects, an interface may comprise a receiver configured to receive information or communications from a device at another device. The interface (e.g., of a processor or a bus) may receive information or data processed by a front end or another device or may process information received. In some aspects, an interface may comprise a transmitter configured to transmit or communicate information or data to another device. Thus, the interface may transmit information or data or may prepare information or data for outputting for transmission (e.g., via a bus).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Further, a "channel width" as used herein may encompass or may also be referred to as a bandwidth in certain aspects.

As used herein, a phrase referring to "at least one of" a list of items refers to any combination of those items, including single members. As an example, "at least one of: a, b, or c" is intended to cover: a, b, c, a-b, a-c, b-c, aa, bb, cc, and a-b-c.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, a processing system, an integrated circuit ("IC"), an access terminal, or an access point or any combination thereof designed to perform the functions described herein. A processing system may be implemented using one or more ICs or may be implemented within an IC (e.g., as part of a system on a chip). In some embodiments, the IC may comprise a general purpose processor, a DSP, an ASIC, an FPGA or other PLD, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray® disc where disks usually reproduce data magnetically, while discs reproduce data optically with lasers. Thus, in some aspects, computer readable medium may comprise non-transitory computer readable medium (e.g., tangible media). In addition, in some aspects computer readable medium may comprise transitory computer readable medium (e.g., a signal). Combinations of the above should also be included within the scope of computer-readable media.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

What is claimed is:

1. An apparatus for wireless communication, comprising:
a low noise amplifier (LNA);
an attenuator configured to:
   receive a signal from the LNA,
   generate a first attenuated signal based on the signal, and
   generate a second attenuated signal based on the signal; and
a processing system configured to:
   measure a first signal strength of the first attenuated signal at a position;
   measure a second signal strength of the second attenuated signal at the position;
   determine a first value based on the first signal strength and the second signal strength;
   determine a second value based on the first attenuated signal and the second attenuated signal; and
   adjust a current of the LNA if the first value exceeds the second value.

2. The apparatus of claim 1, wherein the adjustment comprises increasing the current of the LNA until the first value is equal to or less than the second value.

3. The apparatus of claim 1, wherein the adjustment comprises increasing the current of the LNA until the first value and the second value are within a range of differences of each other or until a difference between the first value and the second value is constant for multiple current levels.

4. The apparatus of claim 1, wherein the attenuator generates the first attenuated signal by attenuating the signal by a first amount and generates the second attenuated signal by attenuating the signal by a second amount and wherein a difference between the first amount and the second amount corresponds to the second value.

5. The apparatus of claim 1 further comprising an analog-digital converter (ADC) and wherein the first and second signal strengths are measured at the ADC.

6. The apparatus of claim 1, wherein the processing system is further configured to determine whether the first value is within a threshold range of the second value and wherein adjusting the current of the LNA by the attenuator comprises adjusting the current of the LNA if the first value exceeds the second value by the threshold range.

7. The apparatus of claim 1, wherein the processing system is further configured to determine an amount of current to adjust the LNA based on a difference between the first value and the second value and wherein the adjustment comprises adjusting the current based on the amount.

8. The apparatus of claim 1, wherein the attenuator is configured to attenuate the signal while the attenuator operates at at least one of a constant temperature, current, process material, or voltage.

9. The apparatus of claim 1, wherein the processing system operates at 60 GHz.

10. A method of wireless communication, comprising:
receiving a signal from a low noise amplifier (LNA);
generating a first attenuated signal based on the signal;
generating a second attenuated signal based on the signal;
measuring a first signal strength of the first attenuated signal at a position;
measuring a second signal strength of the second attenuated signal at the position;
determining a first value based on the first signal strength and the second signal strength;
determining a second value based on the generated first attenuated signal and the generated second attenuated signal; and
adjusting a current of the LNA based on the first value exceeding the second value.

11. The method of claim 10, wherein adjusting the current comprises increasing the current of the LNA until the first value is equal to or less than the second value.

12. The method of claim 10, wherein adjusting the current comprises increasing the current of the LNA until the first value and the second value are within a range of differences of each other or until a difference between the first value and the second value is constant for multiple current levels.

13. The method of claim 10, wherein generating the first attenuated signal comprises generating the first attenuated signal by attenuating the signal by a first amount and wherein generating the second attenuated signal comprises generating the second attenuated signal by attenuating the signal by a second amount and wherein a difference between the first amount and the second amount corresponds to the second value.

14. The method of claim 10, wherein the measuring is performed by an analog-digital converter (ADC) and wherein the first and second signal strengths are measured at the ADC.

15. The method of claim 10, further comprising determining whether the first value is within a threshold range of the second value and wherein adjusting the current further comprises adjusting the current if the first value exceeds the second value by the threshold range.

16. The method of claim 10, further comprising determining an amount of the current to adjust the LNA based on a difference between the first value and the second value and wherein the current is adjusted based on the amount.

17. The method of claim 10, wherein generating the first and second attenuated signals comprises attenuating the signal while operating at at least one of a constant temperature, current, process material, or voltage.

18. The method of claim 10, wherein the wireless communication occurs at 60 GHz.

19. A wireless node for wireless communication, comprising:
an antenna;
a low noise amplifier (LNA) configured to amplify a signal received via the antenna;
an attenuator configured to:
receive a signal from the LNA,
generate a first attenuated signal based on the signal, and
generate a second attenuated signal based on the received signal; and
a processing system configured to:
measure a first signal strength of the first attenuated signal at a position;
measure a second signal strength of the second attenuated signal at the position;
determine a first value based on the first signal strength and the second signal strength;
determine a second value based on the first attenuated signal and the second attenuated signal; and
adjust a current of the LNA if the first value exceeds the second value.

* * * * *